(12) United States Patent
Hoult

(10) Patent No.: US 7,358,737 B2
(45) Date of Patent: Apr. 15, 2008

(54) METHOD OF EFFECTING NUCLEAR MAGNETIC RESONANCE EXPERIMENTS USING CARTESIAN FEEDBACK

(75) Inventor: David Ian Hoult, Winnipeg (CA)

(73) Assignee: National Research Council of Canada, Ottawa, Ontario (CA)

(*) Notice: Subject to any disclaimer, the term of this patent is extended or adjusted under 35 U.S.C. 154(b) by 0 days.

(21) Appl. No.: 10/589,136

(22) PCT Filed: Feb. 24, 2005

(86) PCT No.: PCT/CA2005/000265

§ 371 (c)(1),
(2), (4) Date: May 31, 2007

(87) PCT Pub. No.: WO2005/083458

PCT Pub. Date: Sep. 9, 2005

(65) Prior Publication Data

US 2007/0222449 A1 Sep. 27, 2007

Related U.S. Application Data

(60) Provisional application No. 60/547,430, filed on Feb. 26, 2004.

(51) Int. Cl.
*G01V 3/00* (2006.01)
(52) U.S. Cl. ....................... 324/322; 324/309
(58) Field of Classification Search ........ 324/300–322; 600/407–455; 128/898; 382/128
See application file for complete search history.

(56) References Cited

U.S. PATENT DOCUMENTS

| | | | |
|---|---|---|---|
| 5,051,700 A | 9/1991 | Fox | |
| 6,714,807 B2 * | 3/2004 | Zur | ............................ 600/410 |
| 7,109,714 B2 * | 9/2006 | Rudakov et al. | ............ 324/322 |

FOREIGN PATENT DOCUMENTS

EP 0 823 640 11/1998

OTHER PUBLICATIONS

Hoult, D.I. et al The NMR mult-transmit phased array; a Cartesian feedback approach. Journal of Magnetic Resonance vol. 171-1, Sep. 9, 2004 pp. 64-70 CISTI, Canada Institute for Scientific and Technical Information.

* cited by examiner

*Primary Examiner*—Brij B. Shrivastav
(74) *Attorney, Agent, or Firm*—Adrian D. Battison; Michael R. Williams; Ryan W. Dupuis

(57) ABSTRACT

In nuclear magnetic resonance experiments, Cartesian electronic feedback is used to reduce substantially in transmission and/or reception the deleterious effects of sample-mediated and direct interactions between coils in an array of transmitting and/or receiving coils. The feedback is also used with single or multiple coils to maintain at essentially constant values the relationship between an input transmitter voltage and the magnetic resonance flip angle, and the relationship between transverse nuclear magnetisation and the strength of the free induction decay signal presented by a receiver for analysis, regardless of factors such as sample electrical conductivity.

18 Claims, 9 Drawing Sheets

METHOD OF EFFECTING NUCLEAR MAGNETIC RESONANCE EXPERIMENTS USING CARTESIAN FEEDBACK

This application claims priority under 35USC119 from Provisional Application 60/547430 filed 26 Feb. 2004.

This invention relates to a method of effecting nuclear magnetic resonance experiments using Cartesian feedback.

BACKGROUND OF THE INVENTION

Cartesian feedback, as it is now known in the communications industry, was first mentioned in the context of magnetic resonance in 1989 [C-N. Chen, D. I. Hoult, Biomedical Magnetic Resonance Technology, Adam Hilger, Bristol, 1989, P. 210]. This radio-frequency negative-feedback technique was briefly advocated there, without technical detail, as a cure for distortion in the magnetic resonance (MR) transmission chain.

W. A. Anderson, in U.S. Pat. No. 5,767,677 published Jun. 16, 1998 and entitled Suppression of radiation damping in NMR discloses a method for using feedback in NMR for the specific purpose of the compensation of radiation damping effects. Similar arrangements are disclosed in the papers by P. Broekaert and J. Jeener, *Suppression of radiation damping in NMR in liquids by active electronic feedback*, J. Magn. Reson. A113 (1995) 60-64 and in A. Louis-Joseph, D. Abergel and J. Lallemand, *Neutralization of radiation damping by selective feedback on a 400 MHz spectrometer*, J. Biomol. NMR 5 (1995) 212-216.

However, the present invention discloses that Cartesian feedback can be used in MR experiments in diverse ways to obtain specific effects of significant advantage.

Firstly, it is now well-established and clear that as static field strengths continue to increase, the use of assemblies of the electrical coils needed for MR transmission and reception (often termed "phased array coils") will become more prevalent, particularly in magnetic resonance imaging (MRI). For signal reception, the use of such assemblies of coils, where each coil is appropriately tuned and noise-matched, has been shown unequivocally to yield over elongated volumes of interest a more homogenous spatial response function and/or improved signal-to-noise ratio (S/N). In addition, they may help to counteract propagation effects that are seen at high field strengths, e.g. field-focussing in head images at 8 T. (This is an especial hope during transmission where the coils are tuned and power-matched.) From their inception, however, it was clear that electromagnetic interactions, both direct and via the intermediary of the patient or sample, presented problems in both transmission and reception, as these interactions detuned the coils and introduced correlations between signal and noise voltages.

During signal reception, it is well-known that these interactions are typically tackled: a) By annulling nearest-neighbour reactive components, either by overlapping the coils or by the use of various bridges. (Despite the availability of venerable four-quadrant bridge designs that also remove the resistive components of mutual impedance, these are not usually employed as the resistive cancellation degrades signal-to-noise ratio (S/N) and increases noise correlation.) b) By utilising, in addition, the transformation properties of each coil's tuning and matching network, in conjunction with low input impedance pre-amplifiers, to present a large impedance in series with the coil. This blocks residual resistive current flow in nearest neighbours and is also effective against the smaller combined (resistive and reactive) induced voltages in distant neighbours. The deleterious effects of the interactions are thereby rendered negligible and the coils are effectively decoupled. Note that decoupling methods external to the coils have also been described.

During transmission, an equivalent strategy is to retain the cancellation of nearest-neighbour reactive coupling but to mismatch grossly each transmitter so that each effectively presents a high impedance in series with its coil. However, the loss of efficiency that would be required to produce an adequate decoupling in this manner is intolerable, so other means are needed effectively to increase the transmitter source impedance. The solution we present here is the use of Cartesian feedback.

Secondly, there are numerous defects in, and deficiencies of, magnetic resonance instrumentation, arguably the most serious being that a spectrometer or imager is uncalibrated in an absolute manner. For example, when transmitting, a change of patient in MRI or of the sample in spectroscopy (e.g. non-conducting to conducting, polar to non-polar, etc.) often necessitates a recalibration of pulse power or length to maintain constant excitation of the atomic nuclei. This is because an electrically conducting or dielectrically-lossy sample absorbs power and hence reduces the coil current. Recalibration (albeit less) is still needed even if the coil (or coils) has been re-tuned and re-matched—and this may not even be possible if automatic sample-changing is employed. Concomitantly, upon reception, even if different samples, or the sampled volumes of different patients under observation, contain the same number of nuclei, and even if the excitation has been maintained constant in some manner, the amplitudes of the received free induction decay (FID) signals, as presented to the receiver by the tuning and matching circuitry, may change. With ideal instruments, such changes would not occur. Thus, to take but two examples among many, there would be no need to worry that the swelling of a perfused heart would change the pulse length and the signal strength of some metabolite of interest, or that the breathing of a patient in an imaging experiment would do likewise. A concise way of interpreting this defect is to consider that the effective electrical gains of the transmission and reception chains in magnetic resonance experiments are variable in a manner that depends on the sample or patient.

While we have essentially noted above that change of sample characteristics can change the electrical characteristics of transmission and reception coils, there are also other factors which can do the same. For example, coil capacitance and inductance can be modulated by movement and vibration, the latter causing extra "1/f" noise about a resonance signal in a magnetic resonance spectrum and "t1" noise in two dimensional spectra, via phase modulation. Such vibration can come from air flow, from spinning the sample, from imaging gradient noise, etc. Spinning the sample in high resolution or magic angle experiments can also directly modulate the coil tuning if there is any heterogeneity or asymmetry in the electric susceptibility of the sample. This causes extra spinning sidebands about spectral lines. If more than one coil at the same frequency is used, these sensitivities can increase greatly due to coupling. Examples are high resolution quadrature coils, coils in rotating frame imaging experiments, the phased-array coils mentioned above, etc. While "paddles" or capacitor-resistor leakage bridges can cancel both reactive and resistive interactions, the sensitivity of the balance still renders such solutions susceptible to the factors mentioned above. Change of temperature also affects the electrical characteristics of coils and transmission and reception chains, causing excitations and received signal strengths to drift in amplitude and phase. Now during signal reception, the use of pre-amplifiers with low input impedance can once again ameliorate these problems. Concomitantly, mismatching the transmitter can, in theory, do likewise during transmission. However, as we have seen, the loss of efficiency is unacceptable.

Turning to other ills, crossed diodes in radio-frequency transmit/receive switch circuits cause considerable non-linearity at low pulse powers and as a result, can greatly distort selective or shaped pulses. PIN diode circuits help considerably here, but even they are not distortion-free and their switching times are often excessive. Further, the design of direct current paths that do not compromise the performance of some imaging probes is sometimes problematic. Finally, high power transmitters are renowned for changes of power and phase during a pulse as components rapidly heat, and with poor designs, power supply voltages droop. As noted in Chen and Hoult [op. cit.], pulses are then distorted in amplitude and phase and of course, ambient temperature changes have their destructive role to play here too. Finally, as already noted, radiation damping is a problem of some importance in certain experiments. The use of Cartesian feedback is presented as a solution to all the above problems.

SUMMARY OF THE INVENTION

It is a first object of the invention to provide a method for NMR experiments which provides an improved control of the experiment.

According to one aspect of the invention there is provided a method of effecting magnetic resonance experiments comprising:

providing a location for a sample mounted in a static magnetic field, providing adjacent to the location a transmit coil for generating a required radio-frequency magnetic field, said field being created by the coil carrying radio-frequency current of required frequency, amplitude and phase, said requirements being essentially independent of changes in the electrical characteristics and electrical and physical environment of the coil;

providing a transmitter for creating a radio-frequency signal of said required frequency that produces in the transmit coil a radio-frequency current that generates a radio-frequency magnetic field, the transmitter including a radio-frequency amplifier for setting its said signal to a desired average size, and a modulator that enables the said radio-frequency signal to be set in amplitude and phase by a known value of signal input to the modulator that serves as a measure of the said signal's amplitude and phase;

providing a current detector for supplying values of the amplitude and phase of the actual radio-frequency current in the said transmit coil;

providing adjacent to the location of the sample a receive coil for receiving a radio-frequency signal from the sample generated in response to the transmitted radio frequency magnetic field and the static magnetic field;

providing a receiver for receiving and presenting for analysis the received radio-frequency signal from the receive coil, said receiver including an amplifier for amplifying its radio frequency-signal;

wherein the transmit coil is arranged to be energised by the transmitter with a transmit radio-frequency signal of the required frequency and of which there is a known measure of amplitude and phase;

wherein the transmit coil is arranged to be connected to a current detector which provides a measure of the amplitude and phase of current in the transmit coil;

wherein the method includes:

measuring the current in the transmit coil with said current detector to provide values of the amplitude and phase of the current;

comparing in a comparison step the transmitter's known value of signal input, that serves as a measure of required amplitude and phase, with the values of the amplitude and phase of the measured current, to determine a difference therebetween;

using the said difference to reset the amplitude and phase of the transmit radio-frequency signal input such that the amplitude and phase of the current in the coil are to high accuracy equal to the required value.

In accordance with a second aspect of the invention there is provided a method of effecting magnetic resonance experiments comprising:

providing a location for a sample mounted in a static magnetic field;

providing adjacent to the location a transmit coil for generating a required radio-frequency magnetic field, said field being created by the coil carrying radio-frequency current of required frequency, amplitude and phase, said required values being also required functions of time, but essentially independent of changes in the electrical characteristics and electrical and physical environment of the coil;

providing a transmitter for creating a radio-frequency signal of said required frequency that produces in the transmit coil a radio-frequency current that generates a radio-frequency magnetic field;

the transmitter including:

a radio-frequency amplifier for setting its said signal to a desired average size, a quadrature modulator that enables the said radio-frequency signal to be modulated in amplitude and phase in a manner that can be represented by a pair of orthogonal, modulator-input voltage vectors $T_I$ and $T_Q$, and a pair of filters that output said voltage vectors $T_I$ and $T_Q$ and that receive as inputs the differences, $V_{pI}$ minus $V_{sI}$ and $V_{pQ}$ minus $V_{sQ}$, between two pairs of orthogonal input voltage vectors $V_{pI}$ and $V_{pQ}$ and $V_{sI}$ and $V_{sQ}$;

providing a current detector for supplying values of the amplitude and phase of the actual radio-frequency current in the said transmit coil, the said detector including a quadrature demodulator to generate two orthogonal output voltage vectors $V_{sI}$ and $V_{sQ}$ which are a scaled measure of the amplitude and phase of the current in the said transmit coil and which are passed to the said pair of filters as a part of the said differences;

providing adjacent to the location of the sample a receive coil for receiving a radio-frequency signal or signals from the sample generated in response to the transmitted radio frequency magnetic field and the static magnetic field;

providing a receiver for receiving and presenting for analysis the received radio-frequency signal from the receive coil, said receiver including an amplifier for amplifying its radio frequency signal;

wherein the transmit coil is arranged to be energised by the transmitter with a transmit radio-frequency signal of the required frequency, the required radio-frequency current in the coil being represented by the transmitter orthogonal input voltage pair $V_{pI}$ and $V_{pQ}$ that are functions of time;

wherein the transmit coil is arranged to be connected to the said current detector which provides two orthogonal output voltage vectors $V_{sI}$ and $V_{sQ}$ which are scaled measures of the amplitude and phase of the actual current in a transmit coil;

wherein the method includes:

measuring the actual current in the transmit coil;

supplying with said current detector for the coil a value of the measured current in the transmit coil, the amplitude and phase of which are represented by the two orthogonal voltage vectors $V_{sI}$ and $V_{sQ}$;

comparing in a comparison step the two orthogonal voltage vectors $V_{sI}$ and $V_{sQ}$, which are representative of the measured current in the transmit coil, with the two orthogonal voltage vectors $V_{pI}$ and $V_{pQ}$ which are functions of time and representative of the required current in the transmit coil, to determine a difference therebetween;

feeding the comparisons as difference signals $V_{pI}-V_{sI}$ and $V_{pQ}-V_{sQ}$ through identical filters with outputs $T_I$ and $T_Q$ respectively;

and feeding the filtered comparison signals $T_I$ and $T_Q$ to the quadrature modulator of the transmitter and hence to the said transmit coil so as to constitute a feedback circuit such that the amplitude and phase of the radio-frequency current in the coil are, to high accuracy equal to the required value;

including providing a phase adjustment means, anywhere within the electrical signal loop that constitutes the feedback circuit, to adjust the phase of signals so that the feedback is negative.

Preferably the receiver incorporates a quadrature demodulator and functions, during the time of transmission when it is usually inactive, as the current detector.

Preferably negative group delay circuitry is employed to lessen the delay of the passage of electrical signals through the feedback circuit.

Preferably the transmitter and current detector are so designed as to function in a high magnetic field.

Preferably all or a portion of the functions of detection, modulation, comparison and filtering are performed by digital circuitry.

In accordance with a third aspect of the invention there is provided a method of effecting magnetic resonance experiments comprising:

providing a location for a sample mounted in a static magnetic field;

providing adjacent to the location a transmit coil for generating in the sample a required radio-frequency magnetic field;

providing a transmitter that creates a radio-frequency current in a transmit coil so as to generate the required radio-frequency magnetic field;

providing adjacent to the location of the sample a receive coil for receiving a first radio-frequency signal voltage from the sample, generated in response to the transmitted radio-frequency magnetic field and the static magnetic field;

providing a voltage injector circuit for injecting a second radio-frequency signal voltage into, or in series with, the receive coil, the injector circuit including a radio-frequency attenuator for setting said second signal voltage to a desired average size, and a quadrature modulator that enables the said second radio-frequency signal voltage to be modulated in amplitude and phase in a manner that can be represented by a fraction of two orthogonal input voltage vectors $S_{rI}$ and $S_{rQ}$;

providing a receiver for receiving, amplifying and presenting as output for analysis a measure of the sum radio-frequency voltage in the receive coil, said receiver including an amplifier for amplifying said radio-frequency voltages, a quadrature demodulator for phase-quadrature detection to generate two orthogonal voltage vectors $V_{rI}$ and $V_{rQ}$ which are representative of the amplitude and phase of the sum radio-frequency voltage in the said receive coil, and a pair of filters with inputs $V_{rI}$ and $V_{rQ}$ that output, as the said measure, filtered orthogonal voltage vectors $S_{rI}$ and $S_{rQ}$ for analysis;

wherein to render the orthogonal voltage vectors $S_{rI}$ and $S_{rQ}$ essentially independent of the electrical characteristics and electrical and physical environment of the receive coil, the receive coil is arranged to receive the first signal from the sample and the second signal from the voltage injector:

the receive coil being connected to the receiver input, and the receiver output being connected to the input of the voltage injector;

wherein the method includes:

applying the sum radio-frequency voltage that is at the receive coil to the receiver;

supplying an amplified value of the sum voltage to a demodulator for phase-quadrature detection to generate two orthogonal voltage vectors $V_{rI}$ and $V_{rQ}$ which are representative of the amplitude and phase of the sum voltage at the receive coil;

filtering the two orthogonal voltages $V_{rI}$ and $V_{rQ}$ to generate filtered signals $S_{rI}$ and $S_{rQ}$ suitable for analysis;

feeding the filtered signals $S_{rI}$ and $S_{rQ}$ to the modulator of the voltage injector;

feeding the radio-frequency output of the voltage injector to the said receive coil so as to constitute a feedback circuit such that the signals for analysis $S_{rI}$ and $S_{rQ}$ are to high accuracy independent of the changes in electrical characteristics and electrical and physical environment of the receive coil;

Preferably the transmitter functions, during the time of reception when it is usually inactive, as the voltage injector.

Preferably there is provided a plurality of receive coils, each receive coil having its own independent receiver and voltage injector arranged so as to constitute an independent feedback circuit.

While all the above aspects refer mainly to one transmit coil and one receive coil, there may be additional receive coils as part of a receive coil array and/or there may be additional transmit coils as part of a transmit coil array, as will be well known and appreciated by one skilled in this art.

In addition, the transmit coil or coils and the receive coil or coils may be one and the same or may be independent coils again as will be well known and appreciated by one skilled in this art.

In one preferred arrangement, during the time of transmission when it is usually inactive, the receiver functions as the current detector.

In a particularly preferred arrangement, there is a plurality of transmitting coils, each transmitting coil having its own independent transmitter and current detector for setting the amplitude and phase of its current to its required value. The method defined herein therefore provides an arrangement in which the deleterious effects of coupling between the coils are overcome or at least ameliorated.

BRIEF DESCRIPTION OF THE DRAWINGS

Embodiments of the invention will now be described in conjunction with the accompanying drawings in which.

DETAILED DESCRIPTION

1. Coils During Transmission

Summary: During transmission, the radio-frequency (RF) current in a magnetic resonance (MR) coil that is solitary or one constituent of an assembly comprising a plurality of such coils is monitored and compared in amplitude and phase with that desired—e.g. the current that would be present in the absence of interactions with the remaining coils, the sample or patient, and of other arbitrary deleterious influences in the environment. Any error is corrected by the mechanism of negative feedback, the bandwidth of the transmitter chain and power amplifier for the said coil being restricted to prevent oscillation.

Feedback Theory. For illustrative purposes, we shall consider as a general model just two interacting coils, each being connected to its own transmitter. Our goal will be, by feedback round the first coil's transmitter chain, to block in that first coil the erroneous flow of additional current created therein by virtue of power transferred by coupling from the second coil. If this can be accomplished, then the presumption is that the technique is valid for a sole coil and can also be extended to multiple coils; a further presumption is that as the system is linear, any desired current can accurately be created in any coil, up to the limit of transmitter power capability, regardless of the sample and the electrical and physical details of the environment.

Figure 1:
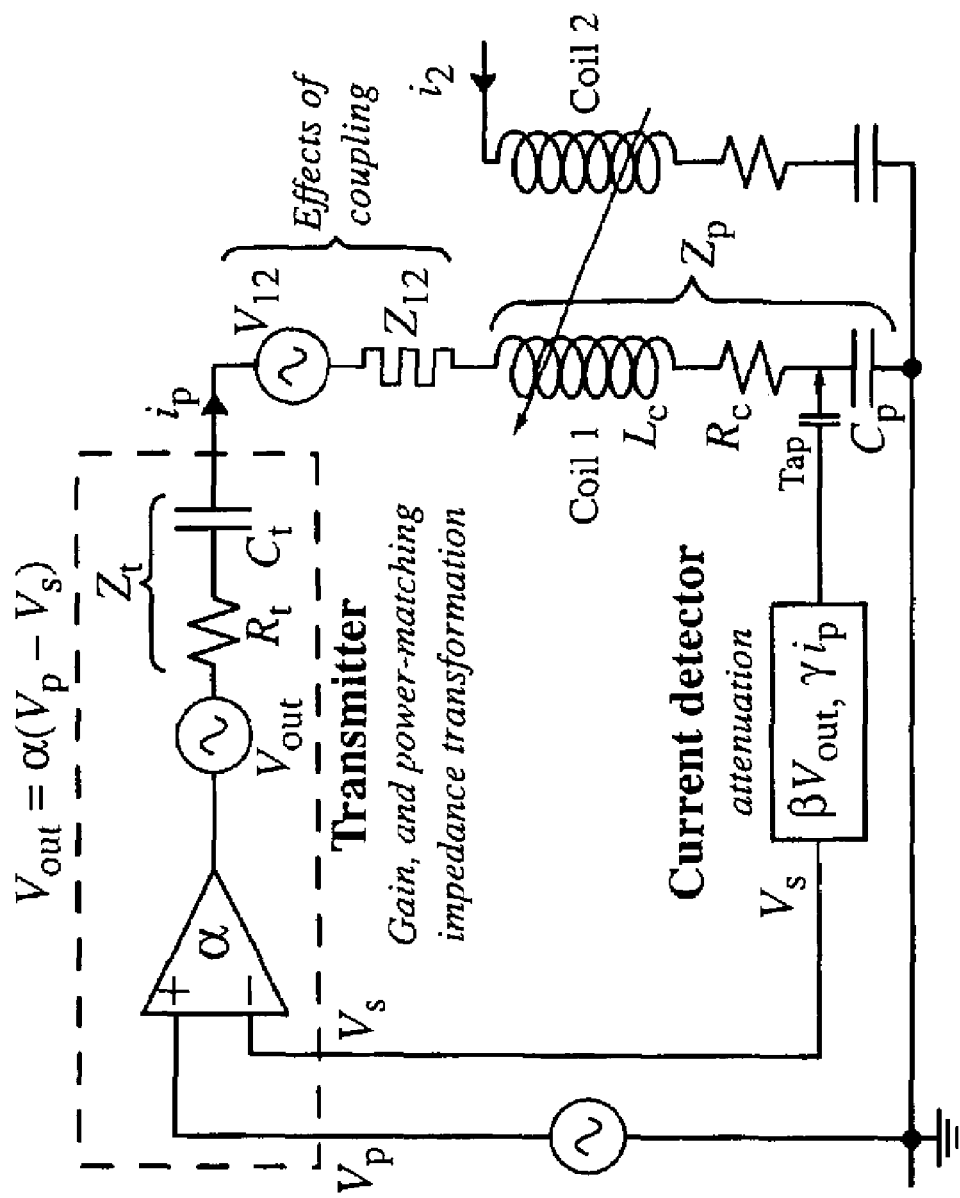
FIG. 1 is a schematic representation of the elements of a transmitter negative feedback configuration.

With reference to FIG. 1, we first assume that our two coils have each been power-matched to their respective transmitters at a given radio frequency $f_0$, in the temporary absence of couplings, in one of the various manners that are well-known in the art. (The MR jargon for this act is "tuning and matching".) Note, however, that for simplicity the required circuitry has been subsumed into the transmitter of FIG. 1, and so coil 1 is driven by a 'transmitter' with effective gain $\alpha$, effective radio frequency output voltage $V_{out}$ and effective source impedance $Z_t$. Impedance $Z_t$ comprises an effective source resistance $R_t$ in series with an effective source capacitance $C_t$. The values of all these quantities are variable, depending upon the matching parameters and frequency—hence the adjective effective.

The first coil plus any capacitor $C_p$ that we choose to add in series therewith, has an impedance $Z_p$ that comprises the reactance of the capacitor $C_p$ plus the reactance of the coil inductance $L_c$ plus the effective resistance $R_c$ of the coil. The effective value of $R_c$, and to a lesser extent that of $L_c$, depends on the coil's environment and in particular, upon the constitution of the sample being investigated. That constitution may be arbitrary. Note that in the absence of coupling to the second coil (e.g. the second coil is open-circuit), by virtue of the power-matching process, source resistance $R_t$ will have been made equal to the effective resistance $R_c$ of the first coil while the capacitances $C_t$ and $C_p$ and coil inductance $L_c$ will have been made resonant with sum zero reactance.

We also have available a small sense voltage $V_s = \gamma i_p$ that is representative of the current $i_p$ flowing in the first coil. Voltage $V_s$ is shown, in exemplary fashion in FIG. 1, as being obtained with a capacitative tap (an inductive sensing method is also described later). Note that proportionality constant $\gamma$, which we may set as desired, has the dimension ohms. If coil 1 is still isolated so that it has no coupling to coil 2, we note that we may write $$V_s = \gamma i_p = \gamma \frac{V_{out}}{R_t + R_c} \equiv \beta V_{out} \qquad (1)$$

Constant $\beta$ is an attenuation factor and is usually $\ll 1$.

Introducing coupling, any current flowing in the second coil induces in the first coil, in series with the transmitter voltage $V_{out}$, an undesired voltage $V_{12}$ of arbitrary amplitude and phase, as shown. Associated with this voltage is a source impedance $Z_{12}$. The current that flows in the first coil is then deleteriously changed and becomes $$i_p = \frac{V_{out} + V_{12}}{R_t + R_c + Z_{12}} \qquad (2)$$

Consider however, the effects of the feedback that is shown in FIG. 1. The sense voltage $V_s$ is compared to the transmitter input voltage $V_p$ by subtraction, and the difference is amplified by the transmitter. Thus $$V_{out} = \alpha(V_p - V_s) \qquad (3)$$

Substituting Eq. (3) in Eq. (2) and setting $V_s = \gamma i_p$, we then have that $$i_p = \frac{\alpha(V_p - \gamma i_p) + V_{12}}{R_t + R_c + Z_{12}} \qquad (4)$$

Solving for the current $i_p$, we obtain $$i_p = \frac{\alpha V_p + V_{12}}{(R_t + \alpha\gamma) + R_c + Z_{12}} \rightarrow \left.\frac{V_p}{\gamma}\right|_{\alpha \to \infty} \qquad (5)$$

The feedback effectively increases the output resistance $R_t$ of the transmitter by an amount $\alpha\gamma$ and if $\alpha\gamma >> R_t + R_c + Z_{12}$ and $\alpha >> V_{12}/V_p$, it is immediately clear from the equation that the influence of the coupling voltage $V_{12}$ upon the current $i_p$ becomes negligible and that the first coil is essentially decoupled from the second. The current $i_p$ becomes proportional to the applied voltage $V_p$, the constant of proportionality $1/\gamma$ being directly under the instrument designer's control.

Further, with any perturbations of $C_t$, $C_p$, $L_c$, $R_c$, $R_t$, $Z_{12}$, $V_{12}$ and/or effective gain $\alpha$, an matter what the origin of those perturbations, for example, but not restricted to if the sample is changed, resulting in a change of probe impedance $Z_p$ and/or of coupling parameters $Z_{12}$ and $V_{12}$; or if the transmitter, or any of the components in circuitry connecting the transmitter to the coil, is non-linear, resulting in a voltage-dependent change of effective gain $\alpha$; or if the matching changes slightly, resulting in changes of gain a and effective transmitter source impedance $Z_t$; or if the sample is spinning resulting in modulation of impedance $Z_p$; or if the coil is being vibrated resulting in modulation of impedance $Z_p$;

it may be seen from Eq. (5) that there is negligible alteration in the current—it is in effect constant at $V_p/\gamma$. The transmitter chain has essentially become a dynamic constant current source of transconductance $1/\gamma$ that is independent of the environment of the coil.

Setting $V_p = 0$ in Eq. (5), we see that the current induced by coupling voltage $V_{12}$ is reduced by a substantial factor, and remembering that current $i_p$ actually flows on account of voltage $V_{out} + V_{12}$ across resistance $R_t + R_c + Z_{12}$, we obtain $$V_{out} = -\frac{\alpha\gamma V_{12}}{(R_t + \alpha\gamma) + R_c + Z_{12}} \rightarrow -V_{12}\bigg|_{\alpha\rightarrow\infty} \quad (6)$$

In other words, the blocking of extraneous current flow in coil 1 is accomplished in practice by the transmitter's producing a voltage almost equal but opposite to $V_{12}$.

Stopping Oscillation: The practical objection to the above theoretical analysis is that any such negative feedback arrangement at radio frequency invariably oscillates. At the frequency of interest $f_0$, the phase of a signal going round the feedback loop has already been manipulated (e.g. by judicious selection of cable length) such that the feedback is negative, as taught by Chen and Hoult [op. cit.]. However, with change of frequency, there is also a change of phase, which they do not consider. This may be caused by the various electronics of amplification, and by the long cables needed to keep the electronics of a magnetic resonance instrument in a low magnetic field well away from the powerful magnet. Whatever the cause, once the phase change has attained 180°, the feedback is positive, and if at the corresponding frequency the gain is >1, oscillation commences. To prevent oscillation from occurring, the gain must have dropped from its large value at frequency $f_0$ to less than unity by this 180° point—the well-known Bode criterion for stability. However, to have such a rapid fall-off of gain with departure of frequency f from $f_0$, the transmitter must include a narrow-band filter centred on the frequency of interest $f_0$. The essence of the Cartesian feedback method lies in the devising of such a filter—one that is stable and reliable—while incorporating it in the subtraction process $(V_p - V_s)$ at the front end of the transmitter. Broekaert and Jeener and Louis-Joseph et al. [op. cit.] teach how, but only in the context of the suppression of radiation damping. (Publications from 1983 on, but in the communications industry, also teach how.)

Now a magnetic resonance transmitter such as that sparsely represented in FIG. 1 usually contains a modulator that allows the radio frequency current in coil 1 to be varied in amplitude and phase. If that modulator is Cartesian (operates in phase-quadrature, a so-called I-Q modulator), it is driven by two varying baseband voltages, say $V_{pI}$ and $V_{pQ}$, in a manner that is well-known. (In magnetic resonance, these voltages are typically generated by a computer.) Voltage $V_{pI}$ modulates an RF signal that either directly, or via an intermediate frequency, gives a resultant that may be represented as a cosine waveform $V_{pI}\cos(2\pi f_0 t)$; voltage $V_{pQ}$ modulates a quadrature-phase RF signal that likewise gives a resultant that may be represented as a sine waveform $V_{pQ}\sin(2\pi f_0 t)$. Summed, these two RF signals at frequency $f_0$ constitute a voltage $V_p$ that is completely variable in amplitude and phase and that can be passed in the transmitter with amplification to the first coil. Importantly, however, voltages $V_{pI}$ and $V_{pQ}$ are a direct measure, albeit at baseband, of the current that we wish to apply to the first coil. Thus we may use these two voltages that represent $V_p$ as a standard against which the current-monitoring voltage $V_s$ is compared.

Figure 2:
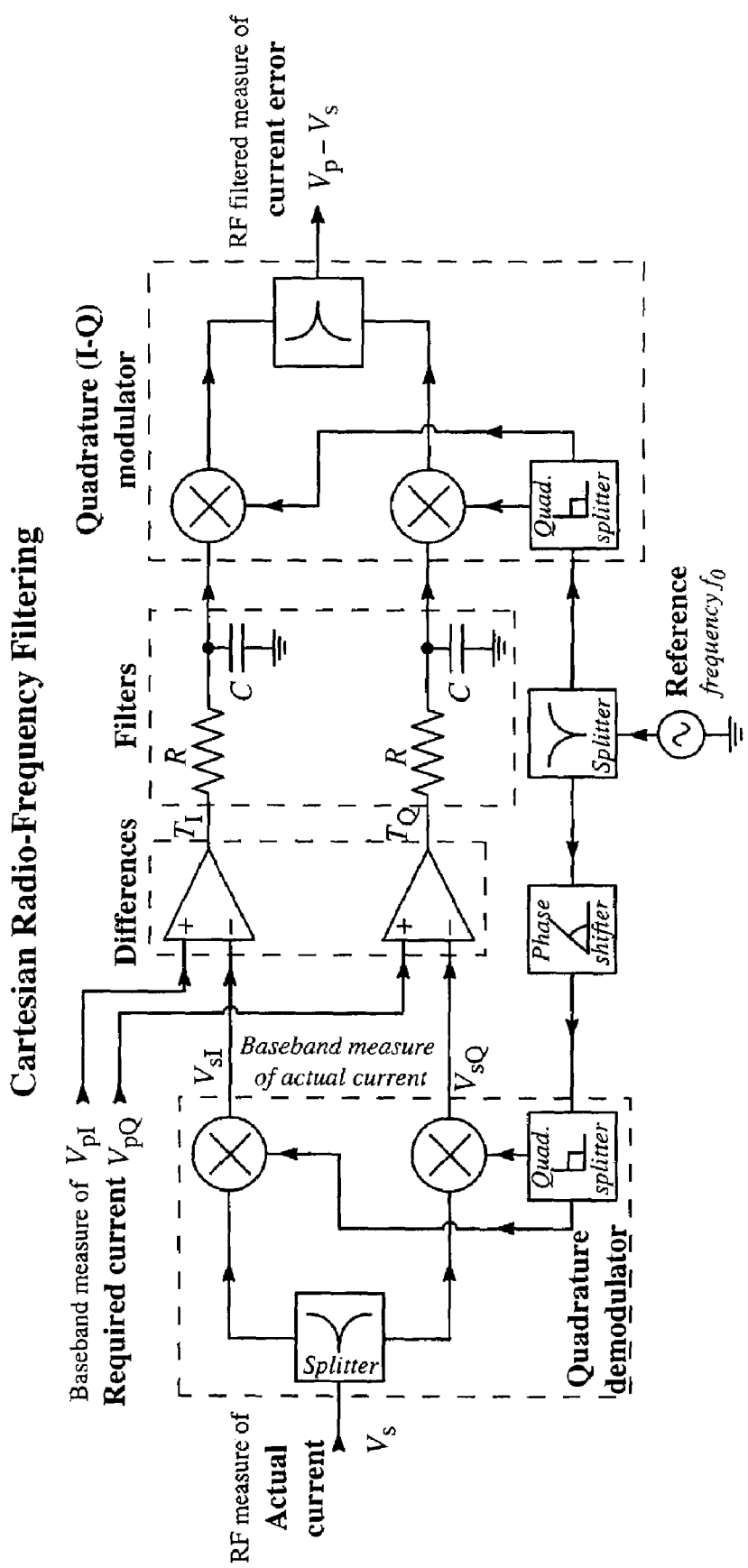
FIG. 2 is a schematic representation of the Cartesian radio-frequency filtering needed to avoid oscillation and render practical the feedback arrangement of FIG. 1.

The principle of the comparison $(V_p - V_s)$ plus the required filtering, all at baseband, is shown in FIG. 2. Radio-frequency current-monitoring signal $V_s$ is detected to baseband with reference frequency $f_0$ in phase quadrature and with adjustable phase in a manner that is well-known. (The figures subsumes the possibility of an intermediate frequency also being used.) The circuits needed to obtain signal $V_s$ and then phase-detect it in quadrature will together be referred to as a 'current detector'. During the detection process, two quadrature baseband voltages $V_{sI}$ and $V_{sQ}$ are created. Note that the bandwidth of any filtering of these signals is as broadband as possible. Its goal is simply to remove unwanted radio-frequency products of the detection process. In that process, the absolute phase of the voltages $V_{sI}$ and $V_{sQ}$ can conveniently be varied, though it is emphasised that there are numerous points in a typical magnetic resonance instrument where such variation of phase can be effected. Phase is correctly set when application of a positive direct modulating voltage $V_{pI}$ to the transmitter modulator causes cosine current to flow in coil 1 such that in-phase voltage $V_{sI}$ be positive while quadrature voltage $V_{sQ}$ remain zero. Equally, with the same correct phase setting, application of a positive direct modulating voltage $V_{pQ}$ to the transmitter modulator causes a sine current to flow in coil 1 such that a positive quadrature voltage $V_{sQ}$ be created while in-phase voltage $V_{sI}$ remain zero. Once the correct phase has been set, the two quadrature signals $V_{sI}$ and $V_{sQ}$ are now suitable for comparison with modulating signals $V_{pI}$ and $V_{pQ}$.

Following comparison by subtraction, the two baseband quadrature difference signals $T_I = (V_{pI} - V_{sI})$ and $T_Q = (V_{pQ} - V_{sQ})$ are passed through identical, low-pass, single-pole, resistor-capacitor (RC) filters, a facet not taught in Chen and Hoult. Single-pole filters may be shown to facilitate the Bode criterion for stability as they never inflict a phase shift of greater than 90°. The filtered signals are then passed to the transmitter quadrature Cartesian modulator and the radio frequency signal $V_p - V_s$ is created. This signal is then passed to the transmitter as in FIG. 1. If the RC filters have a cut-off frequency $f_c$, any signal attempting to travel round the feedback loop at, say, frequency $f_0$−100 $f_c$ will be severely attenuated, as desired. Those skilled in the art of electronic feedback will recognise the usual trade-off between gain and filter bandwidth. The above, then, is the essence of the Cartesian method of implementing stable radio-frequency feedback during transmission.

Proof of Concept: To test the validity of the above idea with an array of coils, we have at present only one nominally-128 MHz feedback magnetic resonance spectrometer, and so have had to tailor an experiment accordingly. Thus, the two-coil array of FIG. 3 was employed. The surface coils sat above a large cuboid of saline (a saline 'phantom'), coil 1 being connected to the spectrometer transmitter while surface coil 2 was driven by a network analyser. Reactive decoupling of the two coils was provided by a reactive tuned loop—a 'paddle'. There remained coupling via the intermediary of the saline phantom. Two measures of current in coil 1 were created by lightly tapping the voltages across two of the coil's tuning capacitors with the aid of baluns. (Together, the tuning capacitors may be considered to be the capacitor $C_p$ of FIG. 1.) This method is preferable, in this instance, to the use of magnetic field sense coils (described later), as the latter may also have a small voltage induced by the RF magnetic field from the second coil. (Alternatively, very weakly coupled, shielded miniature transformers may be used.) When individually sitting above the phantom, both square coils were tuned and nominally matched to 50 Ω with the aid of half wavelength baluns at 126.6 MHz—a convenient frequency, determined by available capacitors, within the tuning range of the spectrometer. Unloaded, the Q-factor of each coil was ~420; loaded by the saline phantom, the factors dramatically reduced to 16 and 15; essentially the sample increased greatly effective coil resistance $R_c$. One coil was slightly further from the phantom (7.2 mm) than the other (4.3 mm) so that the coils could be overlapped if desired. The coils were then brought together to the positions shown in FIG. 3, and with the aid of the network analyser driving the second coil and temporarily receiving signal from the tuned and matched first coil (current monitors not yet used), the coil coupling was measured: it was −9.4 dB. The reactive coupling between the coils was now annulled with a reactive paddle that resonated at 135.5 MHz with a Q-factor of 304 and a tuning capacitor of 7.5 pF. Thus the impedance of the paddle at 126.6 MHz was 0.6-21 j Ω—not a particularly pure reactive condition, but adequate for our purposes. The coupling between the two coils' ports was, however, only reduced to −13.8 dB, showing that considerable resistive coupling remained, via the sample. The input impedance of each previously-matched coil was found to have dropped by roughly 2 Ω to 48 Ω.

Figure 4:
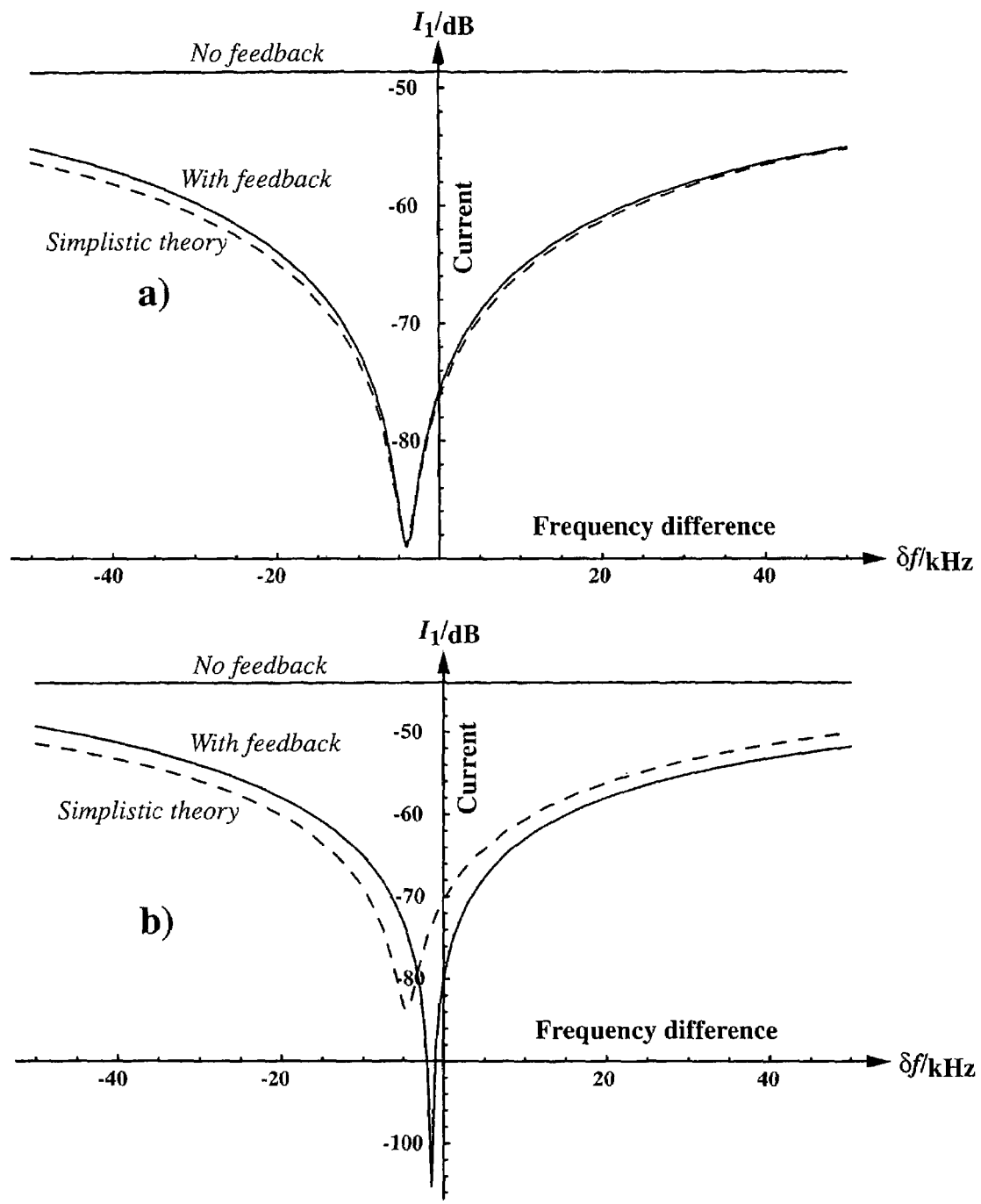
FIG. 4 is a pair of graphs showing the efficacy, with subtleties, of Cartesian feedback in decoupling the coils of FIG. 3. (N.B. the plots in the graphs are shifted to the left because of a difference of 4.6 kHz in frequency standards between the spectrometer and the network analyser of FIG. 3.)

With the network analyser still driving the second coil, the first tuned and matched coil was now connected to the quiescent but operational transmitter of the Cartesian feedback spectrometer. For the safety of the network analyser, lest anything should go wrong, a very low power (1 W maximum) amplifier of nominal output impedance 50 Ω was employed at the end of the transmitter chain. (The tuning and matching network attached to the coil reduced this value to $R_t$~$R_c$~5 Ω.) The first current tap, providing voltage $V_s$, was connected to the spectrometer's receiver, but with the feedback loop open for the moment. (The spectrometer's receiver contained a convenient quadrature phase sensitive detector for generating voltages $V_{sI}$ and $V_{sQ}$, and therefore was used as a current detector, but there was no reason a separate detector circuit could not have been used.) In other words, there was normal transmitter operation with no feedback, but also with no voltages $V_{pI}$ and $V_{pQ}$ applied to the transmitter modulator—the transmitter was merely functioning as a nominal 50 Ω load on the first coil's matching circuitry. The second current-monitoring tap was attached to the receive port of the network analyser and a relative measure of the on-resonance induced current flowing in the first coil was taken—it was −48.6 dB. From the values of the tap capacitors (0.2 pF), we might have expected −50.5 dB, corresponding to the previously-measured −13.8 dB coupling, but both the values of the tapping capacitors and the output resistance of the spectrometer's transmitter were quite nominal. The Cartesian feedback, with $f_c$=1 kHz RC filters and nominally 40 dB open-loop gain, was now turned on. The reduction in the current in the first coil was dramatic (−40.4 dB), as shown in FIG. 4a, and is in reasonable agreement with theory.

The experiment was now repeated with the decoupling paddle removed so that there was reactive as well as resistive coupling between the coils. The induced current, not surprisingly, increased in the absence of feedback from −48.6 dB (FIG. 4a) to −44.0 dB (FIG. 4b), but in the presence of feedback, it is the change in the shape of the response that is noteworthy—it shifts and dips. There is no simple explanation and the phenomenon can only be explained with a full simulation that includes the source impedance $Z_{12}$ of the coupling voltage $V_{12}$. The basic efficacy of the technique, however, remains the same and importantly, there is no sign of current "peaking"—a prelude to possible oscillation.

Figure 3:
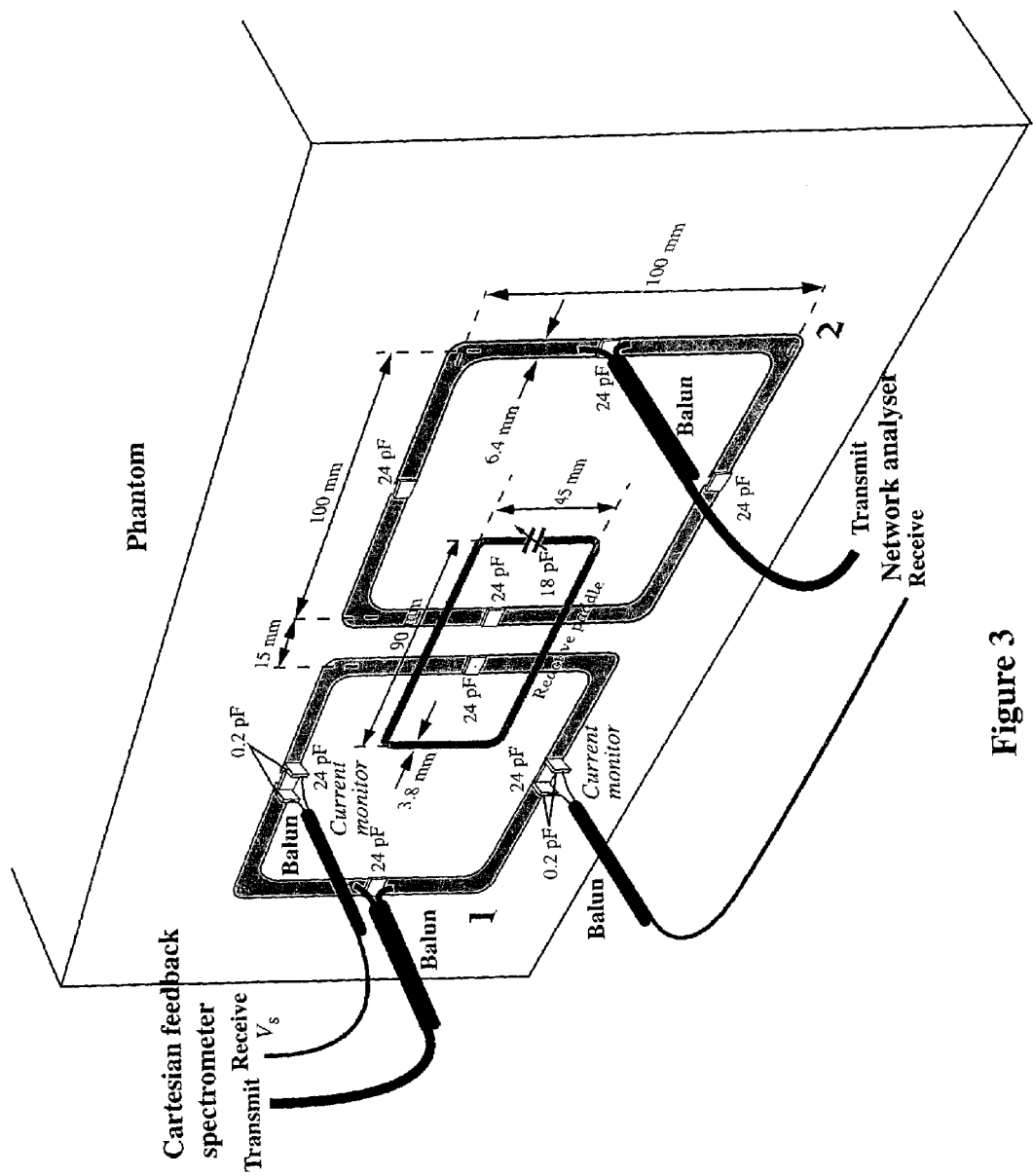
FIG. 3 is a schematic perspective view of two surface coils in close proximity mounted adjacent to a conducting large sample and in a configuration suitable for demonstrating the use of Cartesian feedback to decouple the coils. The coils are reactively decoupled with the aid of the third 'paddle' coil and its capacitor, but resistive coupling via the sample remains.
Figure 5:
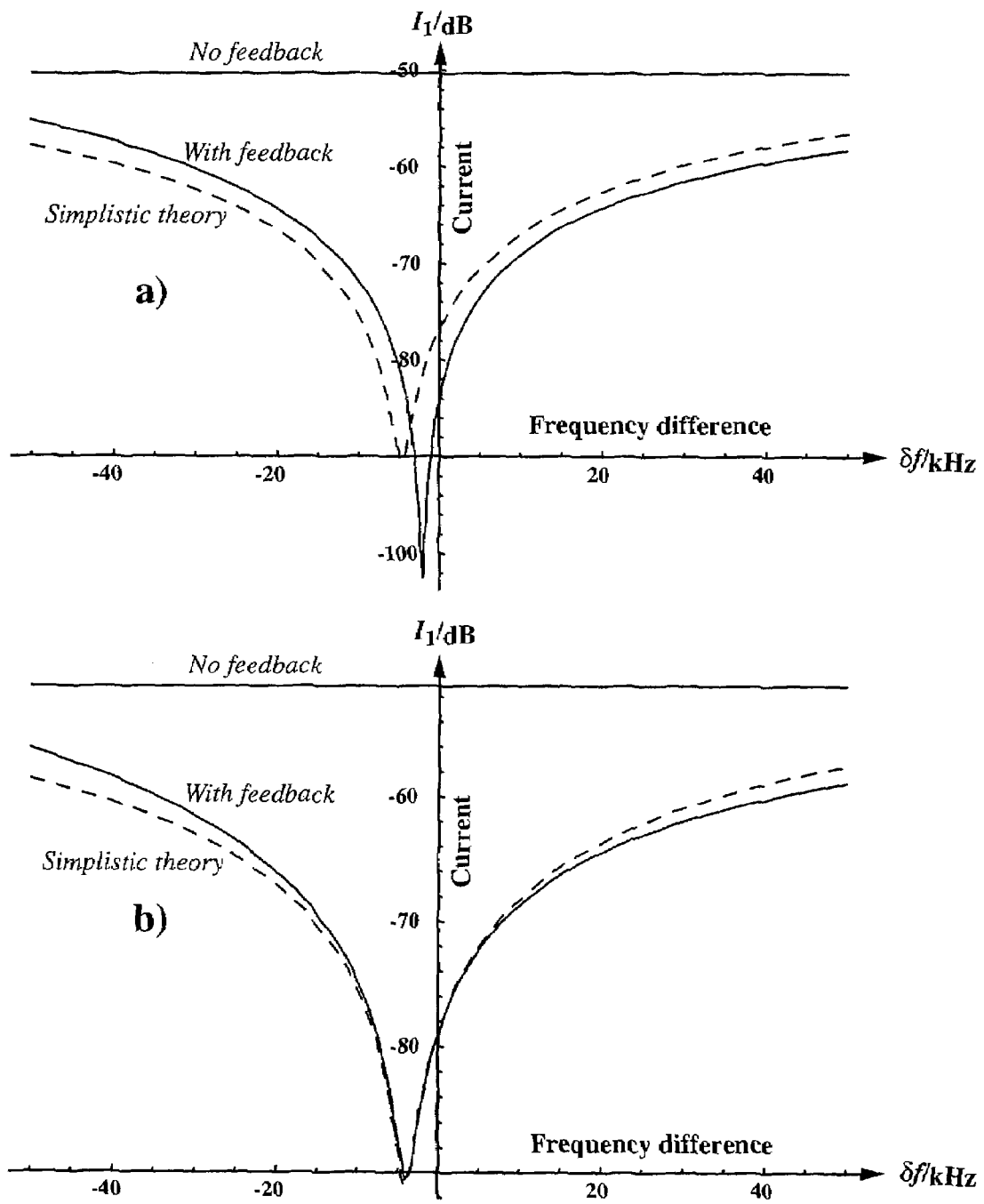
FIG. 5 is a pair of graphs similar to those of FIG. 4, but with the paddle of FIG. 3 removed and the surface coils overlapped to remove inductive coupling.

The experiment was performed once again with the paddle of FIG. 3 removed and the mutual induction between coils now cancelled by overlapping. The results are shown in FIG. 5. In a), the overlap was pre-adjusted for zero mutually-inductive coupling between coils in the absence of the phantom, a common practice. However, the data were obtained in the presence of the phantom. The shift and depression of the experimental feedback current from the theoretical curve (c.f. FIG. 4b) indicate that reactive coupling was still present, presumably contributed by the sample. In b), the coupling was minimised in the presence of the sample by optimising the overlap of the coils. This presumably removed all reactive coupling and resulted in a current curve that at least close to frequency $f_0$, matches the theoretical curve. These results highlight the fact that as well as resistive coupling, the sample contributes appreciable reactive coupling that should be removed. To that end, reactive coupling should always be minimised with the sample in place.

A point of concern, if a similar transmitter were attached to the second coil and turned fully on, was whether the transmitter on the first coil would have to try and exceed its maximum output voltage rating to do the job of opposing the induced voltage $V_{12}$. It may be shown that the overload criterion for a coil-pair with matched transmitters is $|k_{12}|/<2/Q$, where $k_{12}$ is the effective complex coupling factor between the two coils and Q is the common quality factor. Quantity $k_{12}$ for the arrangement of FIG. 3 was therefore measured and found it to be −0.0068+0.072j. With a Q-factor of 16, the criterion was just met; however, with cancellation of reactive coupling it was easily met, and as the real part of $k_{12}$ and 1/Q ride hand in hand, we would expect this generally to be so. With multiple coils, depending on their orientations relative to the first coil, the criterion may need to be tightened somewhat. In this regard, it is worth remembering that in extremis, a mismatch of the transmitters, as described earlier, is still available to provide assistance, as is resistive decoupling at the expense of some power and signal-to-noise ratio.

These experiments demonstrate that it is possible using Cartesian feedback to drive normally and efficiently a power-matched and heavily sample-loaded coil in the presence of another similarly-endowed coupled coil in close proximity. Cartesian feedback applied to the transmitter attached to the latter coil effectively introduces a high resistance in series with that coil that inhibits current from flowing and prevents a back-EMF from being induced in the driving coil—the crosstalk is blocked. For optimal use, any large reactive coupling between coils should first be annulled with one of the various bridge methods available. The obvious inference is that the technique can make a multi-transmit phased array practical, each element being driven from its own Cartesian feedback instrument. It is stressed that no extra transmitter power is needed to produce a given alternating magnetic field when feedback is invoked. This, in turn, opens the door to all the projected advantages of array coils for transmission—localisation of transmission magnetic fields, control of potentially hazardous RF heating of a patient, production of RF magnetic fields having a specific spatial variation, and the creation of homogeneous RF magnetic fields at ultra-high frequencies over those surfaces where it is theoretically possible.

Clearly, as the proximity of the second coil is reduced, we reach the point where the influence of that second coil is negligible. The feedback transmitter is then essentially functioning in isolation. It presumably then retains the advantages outlined above in 'Background to the Invention'. However, the advantage of calibration will be confirmed in the next section in conjunction with calibration of the receiver chain, while a further experiment demonstrating other advantages of Cartesian feedback during transmission will be described is section 3 below.

2. Cartesian Feedback in Reception

Summary: During reception, a signal voltage is induced in a receiving coil by the nuclear magnetic resonance phenomenon. Prior to passage through a pre-amplifier to the magnetic resonance instrument's receiver, this voltage is transformed to a new value by 'noise-matching' circuitry that aims to minimise unwanted electronic noise introduced by that pre-amplifier. The size of the transform depends, among other factors, on the electrical characteristics of the coil. If those characteristics change for any reason, the size of the received signal alters, destroying any calibration of the receiver. Further, thanks to the noise-matching circuitry, current flows in the receiving coil. In like manner to that described during transmission, this current can in turn induce unwanted voltages in other receiving coils that may be part of an array, corrupting thereby the signals they are expected to receive. The introduction of Cartesian feedback solves these problems.

Figure 6:
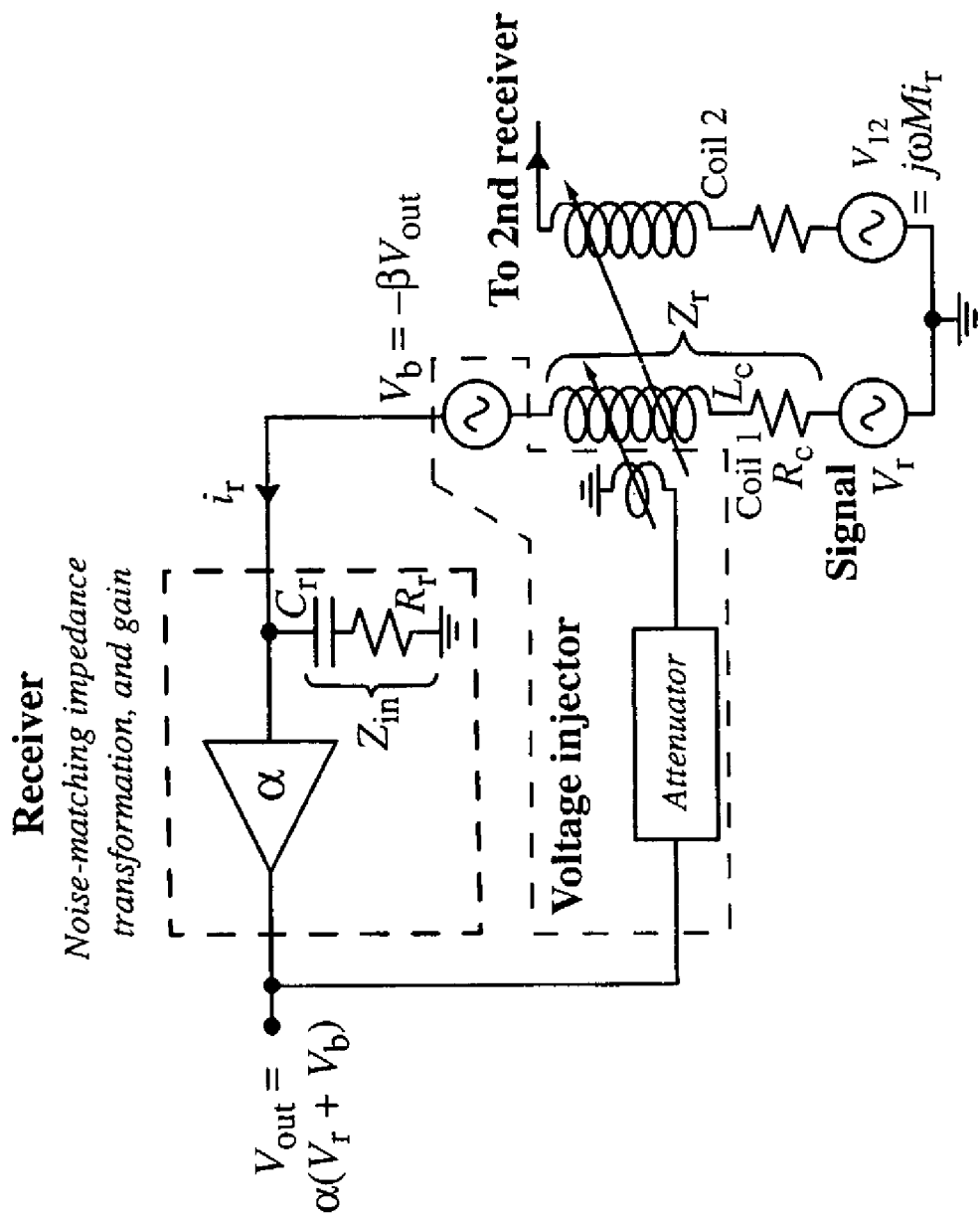
FIG. 6 is a schematic representation of the elements of a receiver negative feedback configuration.

Reception Feedback Theory: For illustrative purposes, we shall consider again for simplicity just two interacting coils, each being connected to its own receiver, as shown in FIG. 6. The magnetic resonance phenomenon induces a small voltage $V_r$ in the receiving coil. In addition, however, a second small and comparable voltage $V_b$ may be injected into, or in series with, the receiving coil circuitry, either by inductive or capacitive coupling using well-known strategies. It is assumed that the impedance associated with this voltage is negligible. As a result of these two voltages, current $i_r$ flows. In a similar philosophy to that used in FIG. 1, the impedance of the noise-matching circuitry is subsumed in the input impedance $Z_{in}$ of the receiver for simplicity. If $Z_{in}$ is low and capacitive so as to resonate with the coil's mainly inductive impedance $Z_r$, significant current $i_r$ may flow. This current then induces an unwanted voltage $V_{12}$ in the second coil. The current is given by $$i_r = \frac{V_r + V_b}{Z_{in} + Z_r} \qquad (7)$$

while the voltage issuing from the receiver is $$V_{out} = \alpha i_r Z_{in} = \alpha(V_r + V_b)\frac{Z_{in}}{Z_{in} + Z_r} \qquad (8)$$

where $\alpha$ is the receiver gain.

To apply negative feedback, we let the additional voltage $V_b$ be a small fraction $\beta$ of the inverted receiver output voltage $-V_{out}$. Then, substituting in Eq. (8) and solving for $V_{out}$, we have that $$V_{out} = \frac{\alpha V_r Z_{in}}{Z_{in}(1+\alpha\beta) + Z_r} = \frac{V_r}{\beta}\bigg|_{\alpha\to\infty} \qquad (9)$$

Clearly, if $\alpha\beta \gg Z_r/Z_{in}$ and $\alpha\beta \gg 1$, the output voltage is independent of the vagaries of impedances $Z_r$ and $Z_{in}$. If these change for any reason, for example, but not restricted to if the sample is changed, thereby changing the effective value of $Z_r$, or if the matching changes slightly, thereby changing the effective value of $Z_{in}$, or if the sample is spinning resulting in modulation of $Z_r$, or if the coil is being vibrated resulting in modulation of $Z_r$, it may be seen from Eq. (9) that there is negligible alteration in the receiver output voltage. The overall effective gain of the receiver chain, from induced signal voltage to receiver output, remains constant. In other words, the instrument may be calibrated and a given number of atoms of magnetic resonance sample will give the same free induction decay signal strength regardless of changes in the probe impedance $Z_r$ caused by change of radio-frequency losses in the sample, etc.

From Eqns. (7) and (9), we may derive the current flowing in the receiver coil. It is $$i_r = \frac{V_r}{Z_{in}(1+\alpha\beta) + Z_r} \qquad (10)$$

Clearly, the feedback has increased the effective input impedance of the pre-amplifier by a factor $1+\alpha\beta$, and the flow of current has been greatly reduced. This phenomenon may be compared with the increase of the transmitter output impedance during transmission with feedback. Thus the unwanted voltage $V_{12}$ induced in the second coil by the current $i_r$ in the first has also been greatly reduced, and if a similar feedback receiver is applied to the second coil the two coils have been essentially decoupled. Negative feedback therefore provides during signal reception an additional method of decoupling array coils that augments the currently-used method of making effective pre-amplifier input impedance $Z_{in}$ as large as possible.

If feedback during reception can be accomplished with multiple coils, both calibration and decoupling are the resulting benefits. However, even with a single coil instrument, there is the substantial benefit of receiver calibration.

Implementation of Feedback Implementation of Cartesian feedback during signal reception is similar to that during transmission, but with the important difference that there is no comparison step at baseband. Rather, the comparison is performed at radio frequency in the receiving coil itself where the two voltages $V_r$ and $V_b$ are added; $V_b$ being a negative quantity $-bV_{out}$, this is equivalent to subtraction. The received signal is detected in phase quadrature and the two baseband signals $R_I$ and $R_Q$ are passed through the RC filters. At this point, the signals are available for use. However, they are also passed on to a quadrature modulator; then, the suitably-attenuated very low power RF signal at frequency $f_0$ is fed back to the receiver coil as voltage $V_b$. Once again, the phase of the quadrature detection must be adjusted so that the feedback is truly negative at frequency $f_0$. We refer to the circuitry that includes this quadrature modulator and attenuator as a 'voltage injector' circuit.

It is emphasised that the function of the filters is not that of the filters associated with normal quadrature signal detection in a traditional analogue magnetic resonance instrument. There, the purpose of the filters (usually multi-pole devices) is to remove unwanted radio-frequency by-products of the detection process, and to match the bandwidth (e.g. 50 kHz) to the sampling rate of analogue-to-digital converters so as to optimise signal-to-noise ratio. In contrast, in both transmission and reception, our purpose is to restrict the bandwidth for the purposes of stability. To that end, the typically-single pole filters may well have bandwidths (e.g. $f_c=1$ kHz) that are considerably less than those needed for optimal signal-to-noise ratio. However, when negative feedback is applied with gain $\alpha$, it is well-known that the available bandwidth opens up by a factor of $\alpha$ and it may then be such (e.g. 50 or 100 kHz) that an optimal signal-to-noise ratio is attained.

Proof of Concept: The Cartesian feedback spectrometer of FIG. 7 was constructed and used in both transmission and reception with a single transmit/receive coil at approximately 128 MHz with the protons in water as a sample. Thus, during transmission, the receiver was used as a current detector, while during reception, the transmitter, minus the power amplifier and with an attenuator, was used as a voltage injector. In the feedback experiments to be described, an open-loop gain of 100 was used with 1 kHz RC filters. Thus the gain-bandwidth product of the system was 200 kHz. To test the instrument in a severe manner, a simple pulse-and-acquire experiment was designed. When not using feedback, the flip-angle $\theta$ to which the nuclear magnetization was subjected during transmission (proportional to the transmission current $i_p$) and the transformed signal strength (received signal voltage $V_r$ transformed by the receiving coil/noise matching) were both made highly dependent on coil loading by the sample. The instrument was used with 360 mL doped (7.5 mM $CuSO_4$) saline samples in bottles (o.d.=53.5 mm, length=187.4 mm) and a 3 T imaging magnet. The probe (tuned coil plus matching) was a shielded, 79.6 mm diameter device employing the well-known Alderman and Grant design (quality factor $Q_{unloaded}=310$, $f_0=127.6$ MHz). It was used for both transmission and signal reception and a small sense coil was attached for sampling of the current (via the RF magnetic field) during transmission and for injection of the feedback voltage (by inductive coupling to the probe) during reception. (Alternatively, a Capacitative Tap, as Described Earlier, or Some Other Method could be Employed.) The attenuation between the matched probe input with no sample and the sense coil output was 36 dB—the sense coil was very weakly coupled. The probe was fixed-tuned and fixed-matched to 50 Ω for an "average" sample (20 mM NaCl, 7.5 mM Cu $SO_4$, $Q_{loaded}=86$), with the aid of a capacitive bridge and a λ/2 balun. A further in-line matching network outside the magnet, to accommodate other probe loadings, was provided by a G-section variable filter. 1 kW of class AB transmission power was available. The pre-amplifier contained a further noise-matching circuit. The lines between the spectrometer and the probe were 12 m long with a velocity factor of 0.8. In both transmission and reception, a full open-loop gain of 40 dB was realised and we encountered no instability when closing the Cartesian feedback loop.

Four samples of the doped saline (0, 10, 20 and 40 mM NaCl) provided an extreme range of probe loading (and hence variation of probe quality factor Q) that would rarely be encountered in practice in a single experiment. The pH of each sample was held slightly below 7 by the addition of a very small amount of HCl to prevent precipitation of the copper. The samples were intended to mimic biological subjects. With the least conducting sample (highest probe Q-factor), the flip angle θ was set to approximately 10° (2 W, 40 ms) with a repetition period of 0.9 s. Now for a power-matched probe, the probe current $i_p$ and hence the flip angle θ, for a given pulse power and duration, depend on the square root $\sqrt{Q}$ of the quality factor of the resonant probe, while transverse magnetisation $M_{xy}$ varies as sin θ. Thus $$dM_{xy}/dQ = d\theta/dQ \, dM_{xy}/d\theta \propto \cos\theta \quad (11)$$

and a small flip angle (cos θ≅1) gives the strongest dependence of transverse magnetisation on Q. For a tuned and matched probe, the output signal following a fixed flip-angle pulse is also proportional to $\sqrt{Q}$, and so the combination of non-fixed small flip-angle and signal dependencies implies that the output should be proportional to Q. In turn, Q is inversely proportional to effective probe resistance which comprises copper losses and losses in the saline sample. The latter is proportional to NaCl concentration σ plus a constant amount from the doping and acid. To summarise, when not employing feedback, we expect the received signal from a tuned and matched probe, with a low flip-angle pulse of constant power and duration, to be inversely proportional to $\sigma_0+\sigma$, where $\sigma_0$ is a constant. This is shown to be so in FIG. 8 where the amplitude of the resulting free induction decay (FID) magnetic resonance signal is plotted against salt concentration.

Figure 8:
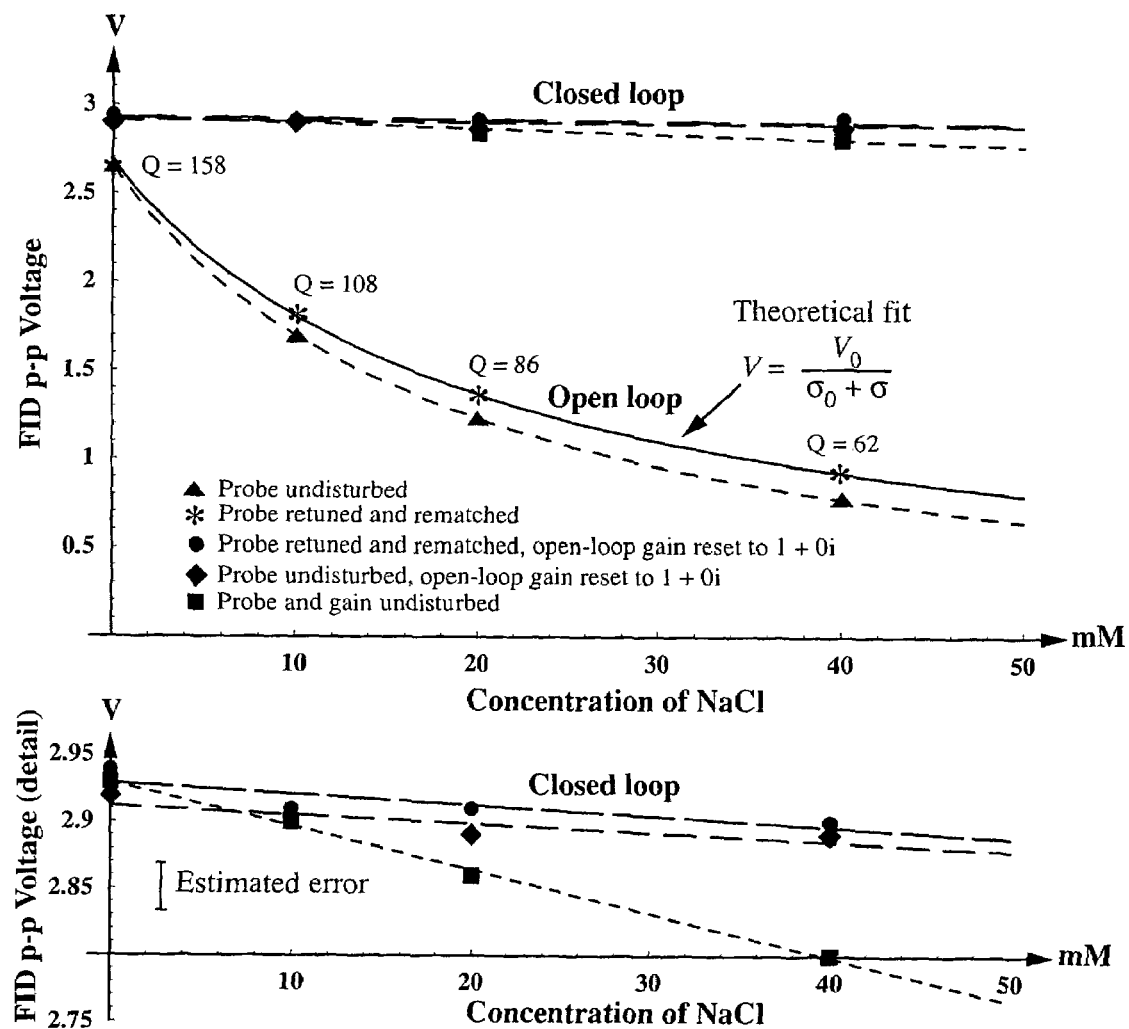
FIG. 8 is a graph (with magnified region) that demonstrates the efficacy of the Cartesian feedback instrument of FIG. 7 in rendering stable and constant the gains of transmitting and receiving chains.

Also plotted in FIG. 8, however, are the results of applying Cartesian feedback under various conditions. For all plots, the probe was initially in-line tuned and matched for the doped sample with no NaCl. All voltages were measured on an oscilloscope, with an estimated error ~±0.5%. The feedback results most immune to sample conductivity were those for which the open-loop gain of the system was reset with each sample change. This task can easily be automated and rendered transparent to the user. The increase in initial FID voltage (at 0 mM NaCl) when the loop is closed was a consequence of the limited available gain resolution of 1 dB (12%). When the system is automated, this change can easily be assessed and corrected by the computer. Summarising, as expected there is a large change in signal amplitude in traditional open-loop mode that matches the theory above, but very little change in closed-loop mode. Thus both the flip angle and the received signal have been stabilised and rendered capable of calibration by virtue of Cartesian feedback.

3. Further Advantages and Design Details

Figure 9:
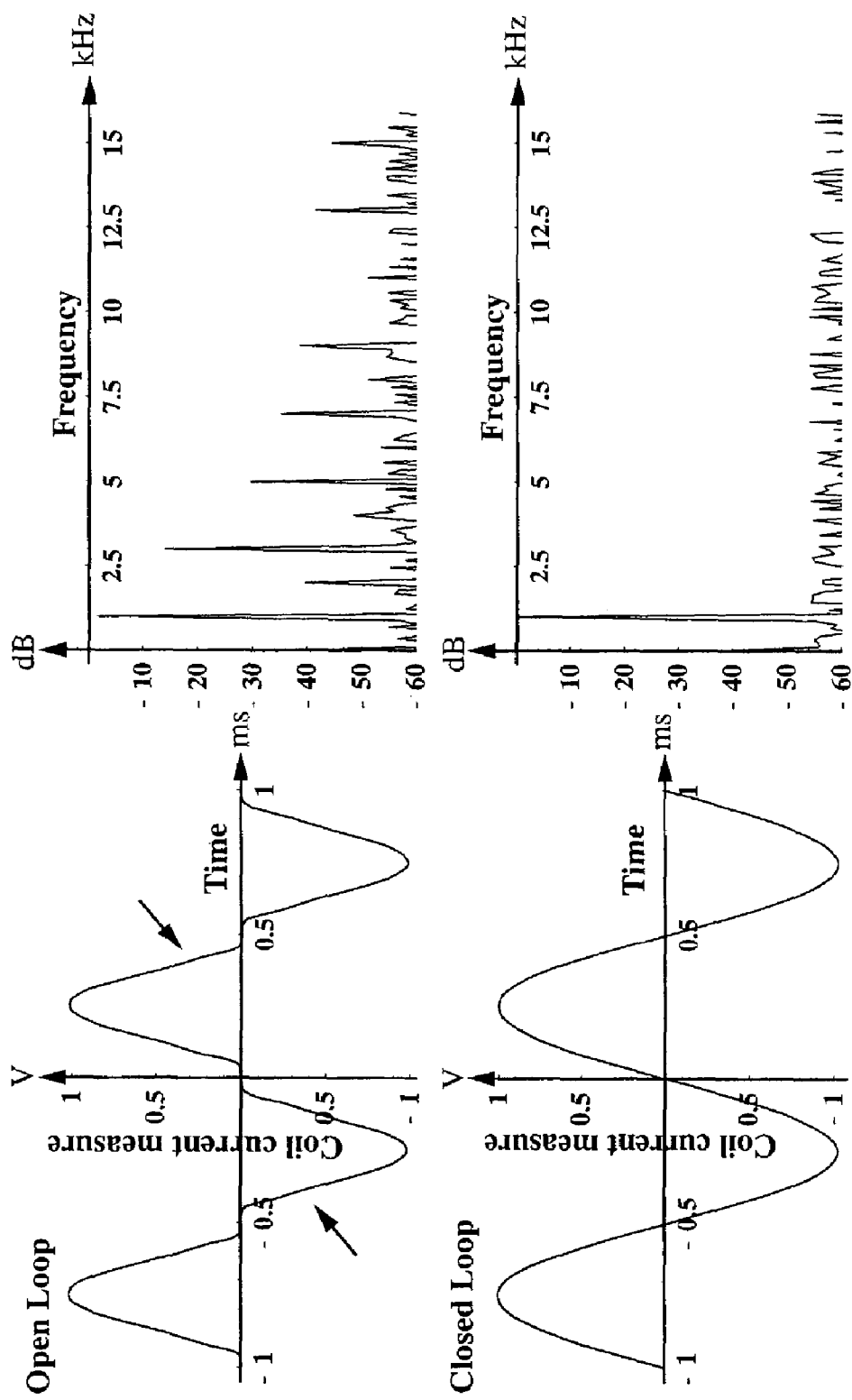
FIG. 9 is a pair of graphs, with accompanying spectral analysis, demonstrating that Cartesian feedback greatly reduces distortion in the transmitter chain.

A further transmission experiment is shown in FIG. 9. Using a crossed diode transmit/receive switch at low power, the transmitter output was modulated with a 1 kHz sine wave. The simultaneous receiver output, which monitored the strength of the current in the coil, is shown in the figure with and without feedback. Without feedback, there is classic crossover distortion, caused by the crossed-diode transmit/receive switch, but note too the distortion in the waveform (arrows), probably caused by the 1 kW power amplifier. The distortions vanish when the feedback loop is closed. This facet of the Cartesian feedback technique is important for maintaining the fidelity of lower power and selective pulses, and should also allow PIN diodes with their attendant problems to be dispensed with in many instances.

Figure 7:
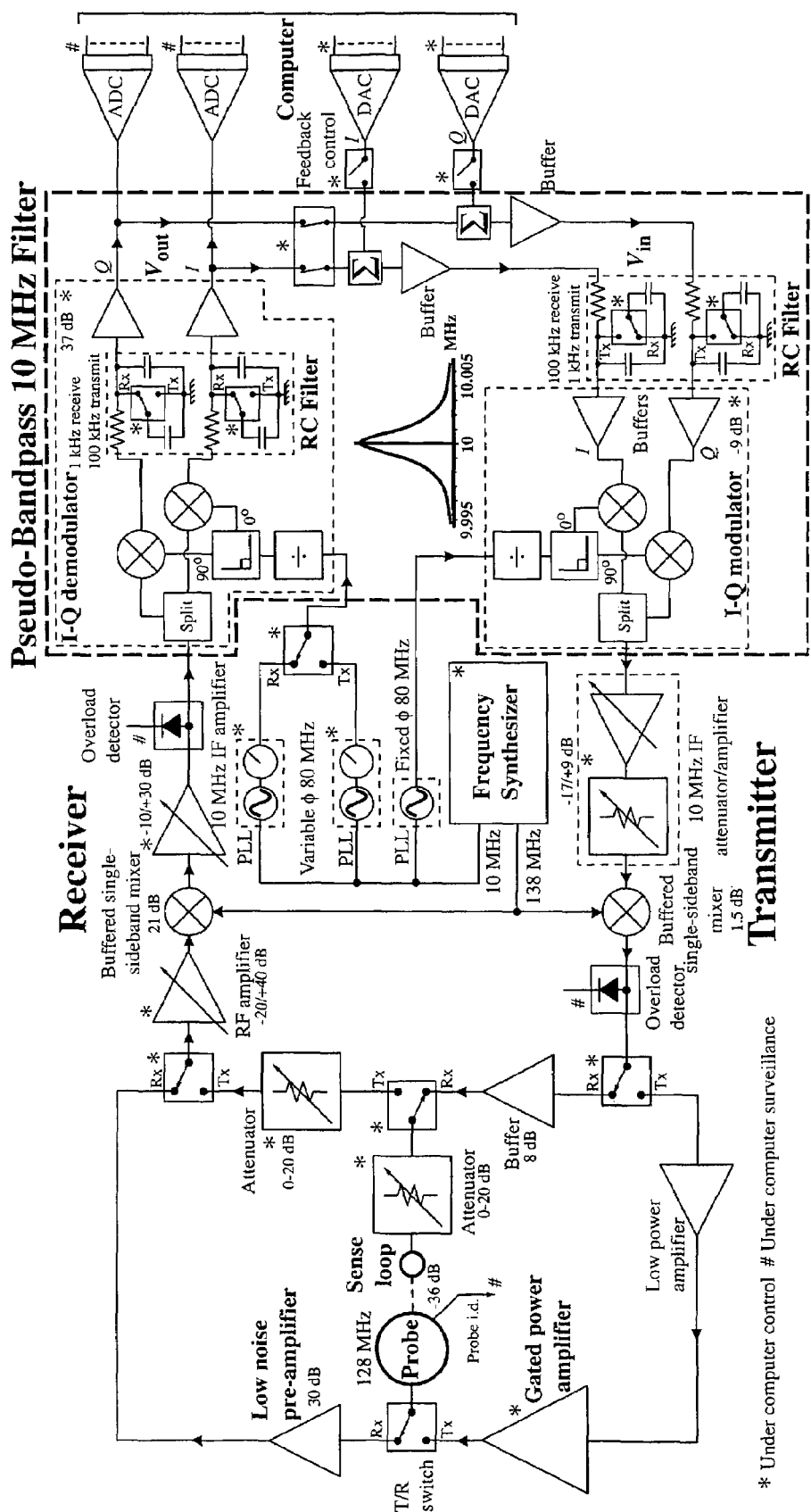
FIG. 7 is a detailed schematic of the Cartesian feedback transmitter and receiver used in obtaining the results in FIGS. 4, 5 and 8.

A primary design decision is whether to construct essentially two instruments that intersect at the probe (transmitter and current detector⇒probe⇒receiver and voltage injector) or to utilise the receiver as the current detector when transmitting, and then use the transmitter as the voltage injector when receiving, albeit with added attenuation and the omission of the power amplifier. Both methods have their advantages and drawbacks that can only be properly debated if both approaches have been attempted. Somewhat arbitrarily, we opted for the second method, as shown in FIG. 7. It is emphasised that with this method, the receiver and transmitter chains are on at all times. However, both philosophies are envisaged as being in the scope of the invention.

As digitised feedback systems can oscillate with 1-bit amplitude, the instrument may be analogue. (However, implementation of Cartesian feedback in digital fashion can be envisaged as digital signal sampling and processing techniques advance.) Thus of prime importance are the matching of the two (I and Q) RC low-pass filters that should dominate the closed-loop performance, and the orthonormality of the quadrature detection and re-modulation processes. We currently achieve an accuracy of 0.1% in amplitude and phase. Note that once the loop is closed, any quadrature-phase errors propagate round the loop. Thus digital received signal sampling at the intermediate frequency of a receiver does not remove them.

Direct voltage offset on the FID received signal is usually considered unimportant as it can be removed during data analysis. However, with a feedback spectrometer, voltage offset during reception translates into a constant small signal at the Larmor frequency's being injected into the probe, which could cause nuclear saturation. Any offset must therefore be scrupulously minimised by good design.

Feedback must be negative and so demodulator detection phase in both reception and transmission has been emphasised. However, it is well-known that the phase round a feedback loop can be adjusted anywhere in the loop to ensure stability. Possibilities, in addition to the control of the phase of the receiver demodulation process, include control of the phase of the transmitter modulation process, control of the phase of any intermediate frequency-changing process in transmitter and/or receiver, insertion of delay lines of appropriate length, insertion of phase-shifters, etc. The possibilities are numerous. Both open-loop gain and phase can be monitored at any convenient time by a computer and adjusted accordingly, no matter what the phase-shifting mechanism. However, widely different phases are typically needed during transmission and reception and thus rapid phase-switching between these two modes is needed. To this end, we employ three synchronised phase-locked loop (PLL) oscillators. One fixed-phase oscillator is the reference for the I-Q modulator, while the other two variable-phase oscillators are references for the receiver quadrature demodulator—references that can be rapidly switched in and out as required.

It is an interesting point that if Cartesian feedback preserves the amplitude of the FID received signal, the noise floor must rise if the Q-factor of the probe drops with change of sample. This is the exact opposite of the usual behaviour, where the probe is re-matched to 50 Ω with change of sample and the signal then drops while the noise remains constant. Note that the feedback neither decreases nor increases the signal-to-noise ratio (S/N) unless there is an engineering error.

With multiple stages of amplification and/or attenuation in both transmitter and receiver at radio and audio frequencies, group delay round the feedback loop can increase frighteningly quickly, limiting the bandwidth over which feedback may be applied. Such delays are usually not of concern in non-feedback (open-loop) commercial instruments. Using such instruments, Broekaert and Jeener and Louis-Joseph et al. (op. cit.) were able to demonstrate Cartesian feedback for elimination of radiation damping, but only because little bandwidth was needed for this application—they were concerned with a single spectral line from water whose linewidth is typically only a few Hz. We, in contrast, are interested in providing a much larger closed-loop bandwidth, comparable to that of a non-feedback commercial instrument, covering a typical MR spectral frequency range (say ~50 kHz). Indeed, for decoupling of array coils, we would like even larger closed-loop bandwidth, as it is only over the open-loop bandwidth (±1 kHz in the current instrument) that decoupling is maximum. Thus particular attention was paid to the various filters needed and the bandwidth of the audio and radio-frequency amplifiers. By scrupulous attention to detail, the group delay through the electronics was reduced to about 250 ns, to which must be added the delays caused by line lengths to the coil and the transfer function of the tuned and matched coil itself.

To increase further the bandwidth, delay of signal round the feedback loop must be further decreased. To this end, so-called "negative group delay" circuitry may be incorporated in the instrument design to reduce the delay, and/or magnetic field-sensitive components may be eliminated from the electronics so that the instrument may be positioned close to the magnetic resonance magnet. At first sight, the concept of a negative delay seems to violate causality. However, this is not the case because the advancement in time is only over a limited bandwidth. An instructive way of thinking about this is to consider the effects of a simple RC filter where, for example RC=1 ms. At frequencies well below its cut-off frequency of 167 Hz, it changes the phase of a signal approximately linearly with frequency—the signal is delayed by 1 ms. Consider now, however, the addition of a second circuit that undoes the filtering. (Such a circuit is easily made with the aid of operational amplifiers up to ~1 MHz.) The delay through the combined circuits is now zero, but if we consider the operation of the second circuit in isolation, it appears magically to advance its signal. The key point here is that we are only considering frequencies very much less than the filter cut-off frequency. In like fashion, because we are only interested in working over a limited bandwidth about the NMR Larmor frequency, we can also counteract delays. However, implementation of the method at radio frequencies is difficult.

Most electronics functions satisfactorily in a magnetic field; the exception is components that employ ferrites. Ferrites are typically used in mixers (modulators, demodulators) and in RF chokes. Thus, to be able to move the MR instrument close to the magnet and so reduce line lengths with their attendant delays, ferrites must be eliminated. To this end, integrated circuit UHF mixers are becoming available and it is possible to make chokes without ferrites—they are simply bulky and inelegant. Thus the idea of an instrument close to the magnet is feasible provided power supplies are kept well clear.

Once Cartesian feedback (with a high open-loop gain) has been applied during transmission, there is a known and fixed relationship, depending solely on the amount of feedback, between the strength of the coil radio-frequency current (and hence the flip angle θ) and the voltage $V_p$ applied to the transmitter via its modulator. Equally, during reception there is a known and fixed relationship, depending solely on the amount of feedback, between the amplitude of the magnetic resonance signal induced in the receiving coil and the voltage issuing from the receiver. It follows that as both feedback factors can be accurately preset by simple electronic manipulation, absolute calibration of a spectrometer is possible. In particular, absolute calibration of a transmit/receive coil/sense coil or capacitative tap combination could be made in the factory. Shipping the ensemble with an embedded chip that the spectrometer's computer could access would allow the computer immediately to set the desired flip angle and to express areas under spectral lines in moles. It is important to let the computer control the set-up and calibration of the instrument when in use, while in the instrument design it is important to have reproducible and accurately defined gain settings.

Since various modifications can be made in my invention as herein above described, and many apparently widely different embodiments of the same made within the spirit and scope of the claims without departure from such spirit and scope, it is intended that all matter contained in the accompanying specification shall be interpreted as illustrative only and not in a limiting sense.

The invention claimed is:

1. A method of effecting magnetic resonance experiments comprising:
   providing a location for a sample mounted in a static magnetic field,
   providing adjacent to the location a transmit coil for generating a required radio-frequency magnetic field, said field being created by the coil carrying radio-frequency current of required frequency, amplitude and phase, said requirements being essentially independent of changes in the electrical characteristics and electrical and physical environment of the coil;
   providing a transmitter for creating a radio-frequency signal of said required frequency that produces in the transmit coil a radio-frequency current that generates a radio-frequency magnetic field, the transmitter including a radio-frequency amplifier for setting its said signal to a desired average size, and a modulator that enables the said radio-frequency signal to be set in amplitude and phase by a known value of signal input to the modulator that serves as a measure of the said signal's amplitude and phase;
   providing a current detector for supplying values of the amplitude and phase of the actual radio-frequency current in the said transmit coil;
   providing adjacent to the location of the sample a receive coil for receiving a radio-frequency signal from the sample generated in response to the transmitted radio frequency magnetic field and the static magnetic field;
   providing a receiver for receiving and presenting for analysis the received radio-frequency signal from the receive coil, said receiver including an amplifier for amplifying its radio frequency-signal;
   wherein the transmit coil is arranged to be energised by the transmitter with a transmit radio-frequency signal of the required frequency and of which there is a known measure of amplitude and phase;
   wherein the transmit coil is arranged to be connected to a current detector which provides a measure of the amplitude and phase of current in the transmit coil;
   wherein the method includes:
   measuring the current in the transmit coil with said current detector to provide values of the amplitude and phase of the current;
   comparing in a comparison step the transmitter's known value of signal input, that serves as a measure of required amplitude and phase, with the values of the amplitude and phase of the measured current, to determine a difference therebetween;
   using the said difference to reset the amplitude and phase of the transmit radio-frequency signal input such that the amplitude and phase of the current in the coil are to high accuracy equal to the required value.

2. The method according to claim 1 wherein the transmit coil and the receive coil are one and the same.

3. The method according to claim 1 or 2 wherein, during the time of transmission when it is usually inactive, the receiver functions as the current detector.

4. The method according to any one of claims 1 through 3 wherein there is a plurality of transmitting coils, each transmitting coil having its own independent transmitter and current detector for setting the amplitude and phase of its current to its required value.

5. A method of effecting magnetic resonance experiments comprising:
   providing a location for a sample mounted in a static magnetic field;
   providing adjacent to the location a transmit coil for generating a required radio-frequency magnetic field, said field being created by the coil carrying radio-frequency current of required frequency, amplitude and phase, said required values being also required functions of time, but essentially independent of changes in the electrical characteristics and electrical and physical environment of the coil;
   providing a transmitter for creating a radio-frequency signal of said required frequency that produces in the transmit coil a radio-frequency current that generates a radio-frequency magnetic field;
   the transmitter including:
   a radio-frequency amplifier for setting its said signal to a desired average size,
   a quadrature modulator that enables the said radio-frequency signal to be modulated in amplitude and phase in a manner that can be represented by a pair of orthogonal, modulator-input voltage vectors $T_I$ and $T_Q$,
   and a pair of filters that output said voltage vectors $T_I$ and $T_Q$ and that receive as inputs the differences, $V_{pI}$ minus $V_{sI}$ and $V_{pQ}$ minus $V_{sQ}$, between two pairs of orthogonal input voltage vectors $V_{pI}$ and $V_{pQ}$ and $V_{sI}$ and $V_{sQ}$;

providing a current detector for supplying values of the amplitude and phase of the actual radio-frequency current in the said transmit coil, the said detector including a quadrature demodulator to generate two orthogonal output voltage vectors $V_{sI}$ and $V_{sQ}$ which are a scaled measure of the amplitude and phase of the current in the said transmit coil and which are passed to the said pair of filters as a part of the said differences;

providing adjacent to the location of the sample a receive coil for receiving a radio-frequency signal or signals from the sample generated in response to the transmitted radio frequency magnetic field and the static magnetic field;

providing a receiver for receiving and presenting for analysis the received radio-frequency signal from the receive coil, said receiver including an amplifier for amplifying its radio frequency signal;

wherein the transmit coil is arranged to be energised by the transmitter with a transmit radio-frequency signal of the required frequency, the required radio-frequency current in the coil being represented by the transmitter orthogonal input voltage pair $V_{pI}$ and $V_{pQ}$ that are functions of time;

wherein the transmit coil is arranged to be connected to the said current detector which provides two orthogonal output voltage vectors $V_{sI}$ and $V_{sQ}$ which are scaled measures of the amplitude and phase of the actual current in a transmit coil;

wherein the method includes:

measuring the actual current in the transmit coil;

supplying with said current detector for the coil a value of the measured current in the transmit coil, the amplitude and phase of which are represented by the two orthogonal voltage vectors $V_{sI}$ and $V_{sQ}$;

comparing in a comparison step the two orthogonal voltage vectors $V_{sI}$ and $V_{sQ}$, which are representative of the measured current in the transmit coil, with the two orthogonal voltage vectors $V_{pI}$ and $V_{pQ}$ which are functions of time and representative of the required current in the transmit coil, to determine a difference therebetween;

feeding the comparisons as difference signals $V_{pI}-V_{sI}$ and $V_{pQ}-V_{sQ}$ though identical filters with outputs $T_I$ and $T_Q$ respectively;

and feeding the filtered comparison signals $T_I$ and $T_Q$ to the quadrature modulator of the transmitter and hence to the said transmit coil so as to constitute a feedback circuit such that the amplitude and phase of the radio-frequency current in the coil are, to high accuracy equal to the required value;

including providing a phase adjustment means, anywhere within the electrical signal loop that constitutes the feedback circuit, to adjust the phase of signals so that the feedback is negative.

6. The method according to claim 5 wherein the transmit coil and the receive coil are one and the same.

7. The method according to claim 5 or 6 wherein the receiver incorporates a quadrature demodulator and functions, during the time of transmission when it is usually inactive, as the current detector.

8. The method according to any one of claims 5 through 7 wherein negative group delay circuitry is employed to lessen the delay of the passage of electrical signals through the feedback circuit.

9. The method according to any one of claims 5 through 8 wherein the transmitter and current detector are so designed as to function in a high magnetic field.

10. The method according to any one of claims 5 through 9 wherein there is a plurality of transmitting coils, each transmitting coil having its own independent transmitter and current detector arranged so as to constitute an independent feedback circuit.

11. The method according to any one of claims 5 through 10 whereby all or a portion of the functions of detection, modulation, comparison and filtering are performed by digital circuitry.

12. A method of effecting magnetic resonance experiments comprising:

providing a location for a sample mounted in a static magnetic field;

providing adjacent to the location a transmit coil for generating in the sample a required radio-frequency magnetic field;

providing a transmitter that creates a radio-frequency current in a transmit coil so as to generate the required radio-frequency magnetic field;

providing adjacent to the location of the sample a receive coil for receiving a first radio-frequency signal voltage from the sample, generated in response to the transmitted radio-frequency magnetic field and the static magnetic field;

providing a voltage injector circuit for injecting a second radio-frequency signal voltage into, or in series with, the receive coil, the injector circuit including a radio-frequency attenuator for setting said second signal voltage to a desired average size, and a quadrature modulator that enables the said second radio-frequency signal voltage to be modulated in amplitude and phase in a manner that can be represented by a fraction of two orthogonal input voltage vectors $S_{rI}$ and $S_{rQ}$;

providing a receiver for receiving, amplifying and presenting as output for analysis a measure of the sum radio-frequency voltage in the receive coil, said receiver including an amplifier for amplifying said radio-frequency voltages, a quadrature demodulator for phase-quadrature detection to generate two orthogonal voltage vectors $V_{rI}$ and $V_{rQ}$ which are representative of the amplitude and phase of the sum radio-frequency voltage in the said receive coil, and a pair of filters with inputs $V_{rI}$ and $V_{rQ}$ that output, as the said measure, filtered orthogonal voltage vectors $S_{rI}$ and $S_{rQ}$ for analysis;

wherein to render the orthogonal voltage vectors $S_{rI}$ and $S_{rQ}$ essentially independent of the electrical characteristics and electrical and physical environment of the receive coil, the receive coil is arranged to receive the first signal from the sample and the second signal from the voltage injector:

the receive coil being connected to the receiver input, and the receiver output being connected to the input of the voltage injector;

wherein the method includes:

applying the sum radio-frequency voltage that is at the receive coil to the receiver;

supplying an amplified value of the sum voltage to a demodulator for phase-quadrature detection to generate two orthogonal voltage vectors $V_{rI}$ and $V_{rQ}$ which are representative of the amplitude and phase of the sum voltage at the receive coil;

filtering the two orthogonal voltages $V_{rI}$ and $V_{rQ}$ to generate filtered signals $S_{rI}$ and $S_{rQ}$ suitable for analysis;

feeding the filtered signals $S_{rI}$ and $S_{rQ}$ to the modulator of the voltage injector;

feeding the radio-frequency output of the voltage injector to the said receive coil so as to constitute a feedback circuit such that the signals for analysis $S_{rI}$ and $S_{rQ}$ are to high accuracy independent of the changes in electrical characteristics, and electrical and physical environment of the receive coil.

13. The method according to claim 12 wherein the transmit coil and the receive coil are one and the same.

14. The method according to claim 12 or 13 wherein negative group delay circuitry is employed to lessen delay of the passage of electrical signals through the feedback circuit.

15. The method according to any one of claims 12 through 14 wherein the receiver and voltage injector are so designed as to function in a high magnetic field.

16. The method according to any one of claims 12 through 15 wherein the transmitter functions, during the time of reception when it is usually inactive, as the voltage injector.

17. The method according to any one of claims 12 through 16 whereby there is provided a plurality of receive coils, each receive coil having its own independent receiver and voltage injector arranged so as to constitute an independent feedback circuit.

18. The method according to any one of claims 12 through 17 whereby all or a portion of the functions of detection, modulation and filtering are performed by digital circuitry.

* * * * *